(12) United States Patent
Lee et al.

(10) Patent No.: US 9,337,032 B2
(45) Date of Patent: May 10, 2016

(54) METHOD OF FORMING PATTERN OF SEMICONDUCTOR DEVICE

(71) Applicant: SAMSUNG ELECTRONICS CO., LTD., Suwon-si, Gyeonggi-do (KR)

(72) Inventors: Hyung-Rae Lee, Hwaseong-si (KR); Yool Kang, Yongin-si (KR); Seong-Ji Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/445,185

(22) Filed: Jul. 29, 2014

(65) Prior Publication Data

US 2015/0118852 A1 Apr. 30, 2015

(30) Foreign Application Priority Data

Oct. 30, 2013 (KR) ........................ 10-2013-0130382

(51) Int. Cl.
*G03F 7/26* (2006.01)
*H01L 21/027* (2006.01)
*G03F 7/40* (2006.01)
*H01L 21/308* (2006.01)
*H01L 21/311* (2006.01)

(52) U.S. Cl.
CPC .............. *H01L 21/0273* (2013.01); *G03F 7/26* (2013.01); *G03F 7/40* (2013.01); *H01L 21/3086* (2013.01); *H01L 21/31144* (2013.01)

(58) Field of Classification Search
CPC ..................................... G03F 7/26; G03F 7/11
See application file for complete search history.

(56) References Cited

U.S. PATENT DOCUMENTS

| 6,579,657 | B1 | 6/2003 | Ishibashi et al. |
| 7,959,818 | B2 | 6/2011 | Jung |
| 2008/0187860 | A1 | 8/2008 | Tsubaki et al. |
| 2011/0027993 | A1 | 2/2011 | Moon et al. |
| 2011/0159253 | A1 | 6/2011 | Kang et al. |
| 2012/0064724 | A1 | 3/2012 | Lee et al. |
| 2013/0040448 | A1* | 2/2013 | Yang ................. H01L 21/76838 438/585 |
| 2014/0004705 | A1 | 1/2014 | Kang et al. |

* cited by examiner

*Primary Examiner* — Kathleen Duda
(74) *Attorney, Agent, or Firm* — Lee & Morse P.C.

(57) ABSTRACT

A method of forming a pattern of a semiconductor device includes providing a substrate, forming a photoresist layer by coating a resist composition including an acid generator and a first resin, the first resin having an acid-labile group, exposing the photoresist layer, forming a photoresist pattern by negatively developing the photoresist layer using a developing solution including an organic solvent, coating a capping composition including a second resin and the organic solvent on the substrate having the photoresist pattern formed thereon, and attaching a capping layer on upper and side surfaces of the photoresist pattern, by baking the capping composition and developing the capping composition using the developing solution including the organic solvent.

19 Claims, 7 Drawing Sheets

US 9,337,032 B2

METHOD OF FORMING PATTERN OF SEMICONDUCTOR DEVICE

CROSS-REFERENCE TO RELATED APPLICATION

Korean Patent Application No. 10-2013-0130382, filed on Oct. 30, 2013, in the Korean Intellectual Property Office, and entitled: "Method Of Forming Pattern Of Semiconductor Device," is incorporated by reference herein in its entirety.

BACKGROUND

Embodiments relate to a method of fabricating a semiconductor device, and more specifically, to a method of forming a pattern of a semiconductor device.

SUMMARY

Embodiments are directed to a method of forming a pattern of a semiconductor device including providing a substrate, forming a photoresist layer by coating a resist composition including an acid generator and a first resin, the first resin having an acid-labile group, exposing the photoresist layer, forming a photoresist pattern by negatively developing the photoresist layer using a developing solution including an organic solvent, coating a capping composition including a second resin and the organic solvent on the substrate having the photoresist pattern formed thereon, and attaching a capping layer on upper and side surfaces of the photoresist pattern, by baking the capping composition and developing the capping composition using the developing solution including the organic solvent.

The second resin of the capping composition may include a same polymer or monomer as the first resin of the resist composition.

The capping composition may have no acid generator.

The capping layer may be deprotected by acid diffused from the photoresist pattern, to be attached on the upper and side surfaces of the photoresist pattern.

The capping composition may include a group that is soluble to the organic solvent.

The capping composition may include a polymeric organic compound having a nitrogen atom.

The capping layer may include a polymeric organic compound containing imidazole or pyrrolidone.

The capping composition may include two functional groups, the two functional groups including a solubility site and an attachment site, respectively.

The capping composition may include a polymer having a polyhydroxy styrene (PHS) monomer unit or a polystyrene (PS) monomer unit.

The organic solvent may include at least one of an n-butyl acetate solvent, a 2-heptanone solvent, and a 5-methyl-2-hexanone solvent.

The organic solvent may include at least one selected from the group of an acetate-based solvent, an ether-based solvent, a ketone-based solvent, an ester-based solvent, an amide-based solvent, a propionate-based solvent, a butyrate-based solvent, a lactate-based solvent, and a combination thereof.

The resist composition may include a positive type chemically amplified resist.

The method may further include, after forming the capping layer, performing an etch process using the capping layer and the photoresist pattern, and removing the capping layer and the photoresist pattern.

The substrate may further include an etching target layer formed thereon.

Embodiments are also directed to a method of forming a pattern of a semiconductor device including loading a substrate into a photolithography apparatus, forming a photoresist layer by coating a resist composition including an acid generator and a first resin, the first resin having an acid-labile group, exposing the photoresist layer, forming a photoresist pattern by negatively developing the photoresist layer using a developing solution containing an organic solvent, coating a capping composition including a second resin and the organic solvent on the substrate having the photoresist pattern formed thereon, attaching a capping layer on upper and side surfaces of the photoresist pattern by baking the capping composition and developing the capping composition using the developing solution including the organic solvent, and unloading the substrate from the photolithography apparatus.

Embodiments are also directed to a method of forming a pattern of a semiconductor device including forming a photoresist layer on a substrate by coating a resist composition including an acid generator and a first resin having an acid-labile group onto the substrate, selectively exposing the photoresist layer, forming a photoresist pattern by removing unexposed portions of the photoresist layer using a developing solution including a first organic solvent, coating a capping composition onto the substrate having the photoresist pattern formed thereon, the capping composition including a second resin having an acid-labile group and a second organic solvent and not including an acid generator, baking the substrate having the photoresist pattern and capping composition formed thereon, such that a capping layer is formed from the capping composition at a contact area between the capping composition and the photoresist pattern, and removing a portion of the capping composition that does not form the capping layer.

The second resin of the capping composition including the acid-labile group may decrease in solubility to an organic solvent when reacted with an acid.

The second resin of the capping composition may include a same polymer or monomer as the first resin of the resist composition. The first organic solvent may be the same as the second organic solvent.

Removing the portion of the capping composition that does not form the capping layer may form a pattern including the photoresist pattern and the capping layer formed thereon.

The method may further include etching the substrate using the photoresist pattern and the capping layer formed thereon as an etch mask.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
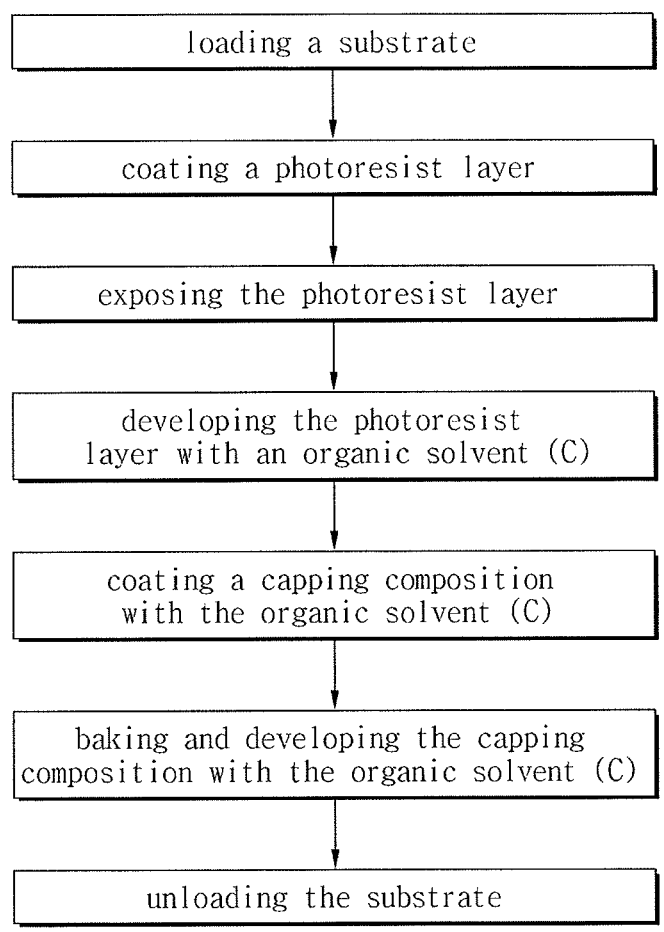
FIG. 1 illustrates a flowchart for describing a method of forming a pattern of a semiconductor device in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. In the following explanation, the same reference numerals denote the same components throughout the specification.

Spatially relative terms, such as "upper," and the like may be used herein to describe the relationship of one element or feature to another, as illustrated in the drawings. It will be understood that such descriptions are intended to encompass different orientations in use or operation in addition to orientations depicted in the drawings.

FIG. 1 illustrates a flowchart for describing a method of forming a pattern of a semiconductor device in accordance with an embodiment. FIGS. 2 to 10 illustrate cross-sectional views and a plan view for describing stages of a method of forming a micro-pattern of a semiconductor device in accordance with an embodiment.

Figure 2:
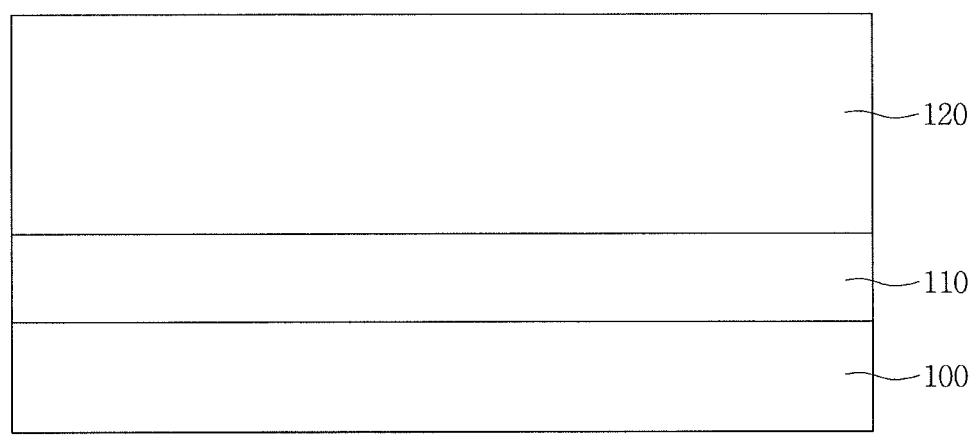
FIGS. 2 to 10 illustrate cross-sectional views and a plan view for describing stages of a method of forming a micro-pattern of a semiconductor device in accordance with an embodiment.

Referring to FIGS. 1 and 2, an etching target layer 110 may be formed on a substrate 100. For example, the substrate 100 may be a semiconductor substrate, such as silicon, germanium, or silicon-germanium. The substrate 100 may include a bulk wafer or an epitaxial layer.

After loading the substrate 100 having the etching target layer 110 formed thereon into a photolithography apparatus including a coating unit, an exposure unit, and a development unit, a resist composition may be coated onto the substrate 100 in the coating unit to form a photoresist layer 120.

The etching target layer 110 may be formed of a variety of materials depending on the usage of a pattern to be formed. For example, the etching target layer 110 may be an insulating layer for forming a contact hole. In addition, when a micro-pattern finally to be formed is formed by etching the substrate 100, the etching target layer 110 may be omitted. For example, when using the method of forming a pattern in accordance with the embodiment for defining an active region in the substrate 100, the etching target layer 110 may be omitted. If desired, an anti-reflection layer including an organic material, an inorganic material, or a combination thereof, may be formed on the etching target layer 110 before forming the photoresist layer. If the etching target layer 110 is omitted, the anti-reflection layer may be formed on the substrate 100.

The photoresist layer 120 may be formed of a resist composition including an acid generator and a resin A1 (for example, a first resin) having an acid-labile group. For example, the photoresist layer 120 may be formed of a resist composition for a KrF excimer laser (248 nm), a resist composition for an ArF excimer laser (193 nm), a resist composition for an F2 excimer laser (157 nm), or a resist composition for an extreme ultraviolet (EUV)(13 nm). The resist composition may include a positive type chemically amplified photoresist in which an acid-catalyzed deprotection reaction of the acid-labile group occurs, e.g., when the acid generator is irradiated with an active light such as laser light, EUV, etc.

The resin A1 of the resist composition may be a polymeric organic compound having a film-forming ability. The resin A1 may be a suitable resin for increasing alkali solubility, and decreasing solubility in a developing solution containing an organic solvent, under an action of an acid. The resin A1 may include an acid-labile group that protects a hydrophilic group, such as a hydroxyl group, a carboxyl group, and a lactone group. For example, the resin A1 of the resist composition may be a novolac resin, a hydroxy styrene resin, or an acrylic ester resin. The acid-labile group may be an ester group or an acetal group, as examples.

The acid generator of the resist composition may be a photo-acid generator (PAG) generating acid ($H^+$) when irradiated with an active light. For example, the PAG may include an onium salt group, such as an iodonium salt or a sulfonium salt, a nitrobenzyl sulfonate group, an imino sulfonate group, a diazomethane group, a disulfone group, or a combination thereof.

Figure 3:
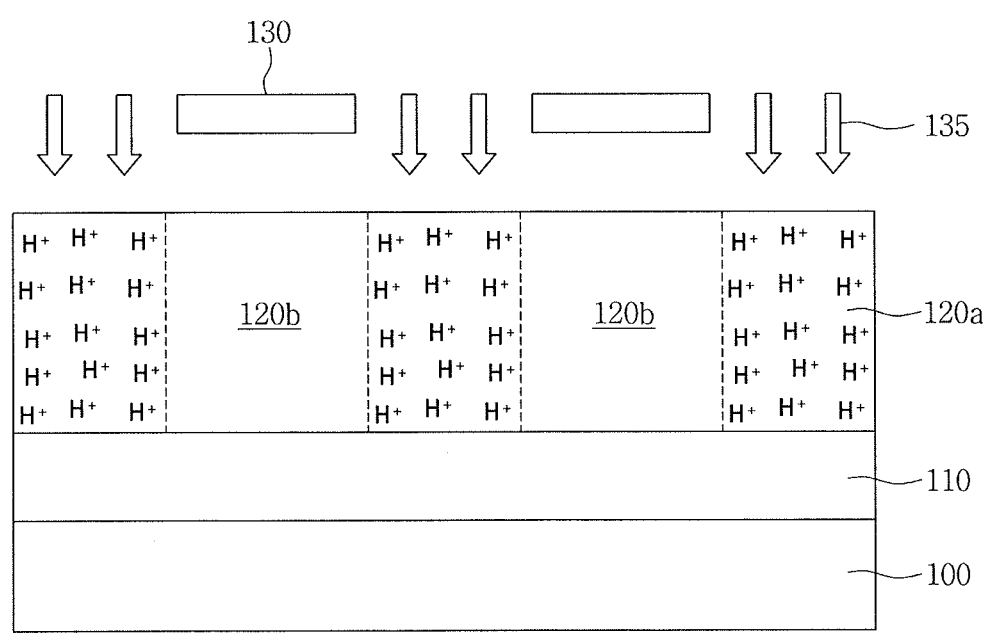

Referring to FIGS. 1 and 3, an exposure process may be performed on the photoresist layer 120 formed on the substrate 100 after moving the substrate 100 to the exposure unit of the photolithography apparatus. If desired, a pre-exposure bake process may be performed before exposing the photoresist layer 120, to form the photoresist layer 120 uniformly.

Hereinafter, the exposure process will be described in detail.

An active light 135, such as a KrF excimer laser, an ArF excimer laser, an F2 excimer laser, or an EUV (13.5 nm), may be selectively irradiated on the photoresist layer 120 through an exposure mask 130. The photoresist layer 120 may be divided into an exposed part 120a and an unexposed part 120b by the exposure process. The exposed part 120a of the photoresist layer 120 may generate a large amount of acid ($H^+$) from the PAG, and the unexposed part 120b may not generate the acid ($H^+$).

The exposed part 120a of the photoresist layer 120 may undergo an acid-catalyzed deprotection reaction in which an acid-labile group is dissociated by an action of the acid ($H^+$) generated from the PAG. A plurality of hydrophilic groups, such as hydroxy groups, carboxyl groups, and lactone groups, may be generated to increase alkali solubility, while decreasing solubility in a developing solution containing an organic solvent. The unexposed part 120b of the photoresist layer 120 is not irradiated with the active light 135. Accordingly, the unexposed part 120b of the photoresist layer 120 may remain at an initial state of being easily dissolved in the developing solution including the organic solvent.

After the exposure process is finished, a post-exposure bake process may be performed on the photoresist layer 120 (120a and 120b).

Figure 4:
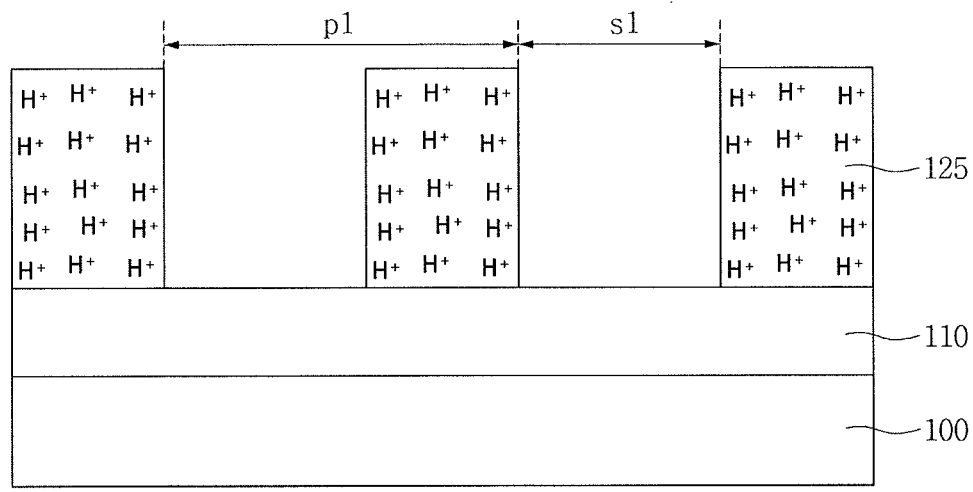

Referring to FIGS. 1 and 4, after the substrate 100 is moved to the development unit of the photolithography apparatus, the photoresist layer 120 (120a and 120b) is developed to form photoresist patterns 125 in a negative tone development process using a developing solution containing an organic solvent C. The photoresist patterns 125 may be formed at a first pitch p1 and a first space s1. The first space s1 between the photoresist patterns 125 may have a size corresponding to the exposure mask 130.

After the exposure process, the exposed part 120a of the photoresist layer 120 may have a decreased solubility to the developing solution containing the organic solvent C, and the unexposed part 120b may be in the state of being easily dissolved in the developing solution containing the organic solvent C. When the photoresist layer 120 comes into contact with the developing solution containing the organic solvent C, the unexposed part 120b may be dissolved in the developing solution to be removed, and the exposed part 120a may not be dissolved in the developing solution and may remain intact. Thereby, negative-image photoresist patterns 125 may be formed.

The photoresist pattern 125 may be an alkali-soluble organic compound having hydrophilic groups dissociated from the acid-labile group. The photoresist pattern may have a low solubility to the developing solution containing the organic solvent C. A large amount of acid ($H^+$) generated from the PAG may be present in the photoresist pattern 125.

The organic solvent C contained in the developing solution may be a suitable organic solvent that dissolves the unexposed part 120b, which does not generate acid ($H^+$). For example, the organic solvent C may include one of an n-butyl acetate solvent, a 2-heptanone solvent, and a 5-methyl-2-hexanone solvent. In addition, the organic solvent C may include an acetate-based solvent, a ketone-based solvent, an ether-based solvent, an ester-based solvent, an amide-based solvent, a propionate-based solvent, a butyrate-based solvent, a lactate-based solvent, or a mixture thereof. For example, the organic solvent C may include cyclohexane; cyclohexanone; a acyclic and cyclicether, such as dimethyl ether, diethyl ether, ethylene glycol, propylene glycol, hexylene glycol, ethylene glycol monomethyl ether, ethylene glycolmethyl ethyl ether, diethyleneglycol monomethyl ether, diethyleneglycol monoethylether, diethyleneglycol dimethylether, propylene glycol methyl ether, propylene glycol ethyl ether, propylene glycolpropyl ether, propylene glycol butyl ether, tetrahydrofuran, ordioxane; an acetate, such as methylacetate, ethylacetate, propylacetate, butylacetate, methylhydroxyacetate, ethylhydroxyacetate, propylhydroxy acetate, butylhydroxyacetate, methyl methoxyacetate, ethyl methoxyacetate, propyl methoxyacetate, butyl methoxyacetate, methyl ethoxyacetate, ethyl ethoxyacetate, propyl ethoxyacetate, butylethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, propylene glycolmethyl etheracetate, propylene glycolethyl etheracetate, propylene glycolpropyl etheracetate, propylene glycolbutyl etheracetate, methyl cellosolveacetate, orethyl cellosolveacetate; a propionate, such as methyl 3-hydroxypropionate, ethyl 3-hydroxypropionate, propyl 3-hydroxypropionate, butyl 3-hydroxypropionate, methyl 2-methoxypropionate, ethyl 2-methoxypropionate, propyl 2-methoxypropionate, butyl 2-methoxypropionate, methyl 2-ethoxy propionate, ethyl 2-ethoxy propionate, propyl 2-ethoxy propionate, butyl 2-ethoxy propionate, methyl 2-butoxy propionate, ethyl 2-butoxy propionate, propyl 2-butoxy propionate, butyl 2-butoxy propionate, methyl 3-methoxy propionate, ethyl 3-methoxy propionate, propyl 3-methoxy propionate, butyl 3-methoxy propionate, methyl 3-ethoxy propionate, ethyl 3-ethoxy propionate, propyl 3-ethoxy propionate, butyl 3-ethoxy propionate, methyl 3-propoxy propionate, ethyl 3-propoxy propionate, propyl 3-propoxy propionate, butyl 3-propoxy propionate, methyl 3-butoxy propionate, ethyl 3-butoxy propionate, propyl 3-butoxy propionate, butyl 3-butoxy propionate, propylene glycol methyl ether propionate, propylene glycol ethyl ether propionate, propylene glycol propyl ether propionate, orpropylene glycol butyl ether propionate; oxyisobutyric ester; a butyrate, such as methyl-2-hydroxy isobutyrate, methyl α-methoxy isobutyrate, ethyl methoxy isobutyrate, methyl α-ethoxy isobutyrate, ethyl α-ethoxy isobutyrate, methyl β-methoxy isobutyrate, ethyl β-methoxy isobutyrate, methyl β-ethoxy isobutyrate, ethyl β-ethoxy isobutyrate, methyl β-isopropoxy isobutyrate, ethyl β-isopropoxy isobutyrate, isopropyl β-isopropoxy isobutyrate, butyl β-isopropoxy isobutyrate, methyl β-butoxy isobutyrate, ethyl β-butoxy isobutyrate, butyl β-butoxy isobutyrate, methyl α-hydroxy isobutyrate, ethyl α-hydroxy isobutyrate, isopropyl α-hydroxy isobutyrate, orbutyl α-hydroxy isobutyrate; alactate, such as methyl lactate, ethyl lactate, propyl lactate, orbutyl lactate, or a combination thereof.

Figure 5:
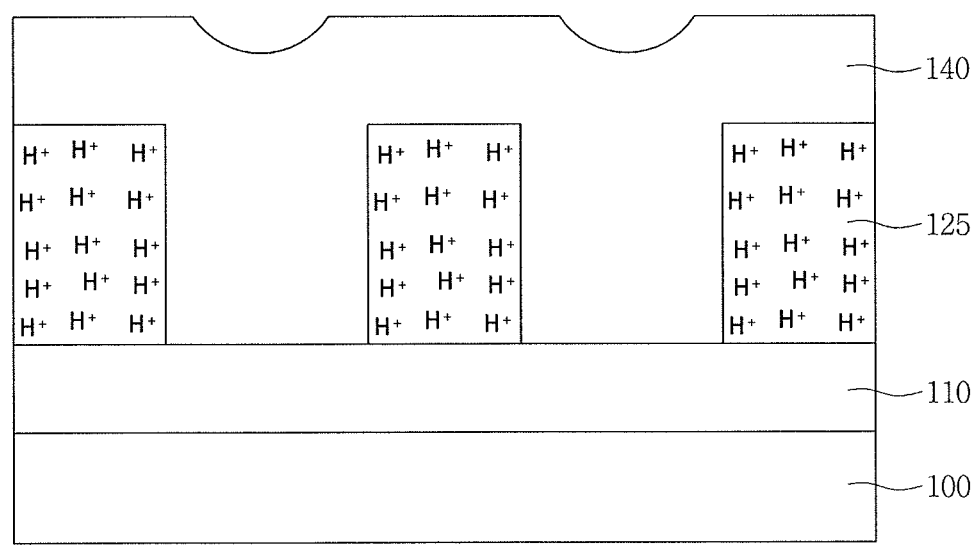

Referring to FIGS. 1 and 5, a chemical attachment process may be performed on the substrate 100 in which the photoresist pattern 125 is formed.

A capping composition 140 may be coated onto the substrate 100 on which the photoresist pattern 125 is formed. The capping composition 140 may be coated using the same organic solvent as the organic solvent C used in the negative developing solution of the photoresist pattern 125.

The capping composition 140 may be an organic compound including a resin A2 (for example, a second resin) and the organic solvent C.

The resin A2 may be a suitable resin to be properly dissolved in the organic solvent C to form a uniform solution. The resin A2 of the capping composition 140 may include the same monomer or polymer as the resin A1 of the resist composition. The resin A2 of the capping composition 140 may have an acid-labile group that protects a hydrophilic group, such as a hydroxy group, a carboxyl group, or a lactone group. For example, the resin A2 of the capping composition 140 may be a novolac resin, a hydroxy styrenic resin, an acrylic ester resin, etc. The acid-labile group may include an ester group or an acetal group.

The capping composition 140 may include a solubility site with respect to the organic solvent C. The capping composition 140 may be formed of a polymer including a nitrogen atom. The capping composition 140 may include a polymeric organic compound containing carbon, nitrogen, and hydrogen. For example, the capping composition 140 may include a compound containing pyrrolidone, or a polymeric organic compound containing imidazole ($C_3H_4N_2$).

Figure 12:
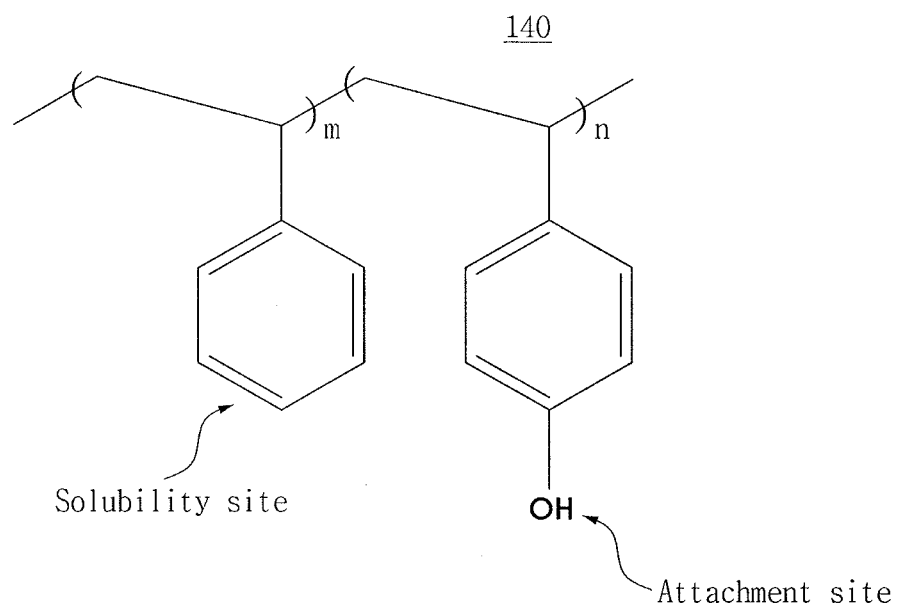
FIG. 12 illustrates a view showing a chemical structure of a capping composition in accordance with still another embodiment.

The capping composition 140 may include both functional groups that are a solubility site and functional groups that are an attachment site, as shown in FIG. 12. For example, the capping composition 140 may include polymers having polyhydroxy styrene (PHS) monomer units and/or polystyrene (PS) monomer units.

The capping composition 140 may not include an acid or an acid generator since the capping composition 140 is not patterned in a photolithography process.

In a comparative example chemical attachment process, a capping composition formed of a water-soluble organic compound is used. Attacks to photoresist patterns, coating failures in the capping composition, etc., may occur since the photoresist patterns formed of the water-soluble organic compound is dissolved while coating the capping composition. On the other hand, according to embodiments disclosed herein, the capping composition 140 may be coated by using an organic solvent C on the photoresist pattern 125 having a high solubility to an aqueous alkaline solution and a low solubility to a developing solution containing an organic solvent. Accordingly, the photoresist pattern 125 may be prevented from being dissolved while coating the capping composition 140.

The capping composition 140 is fabricated by dissolving the resin A2 in the organic solvent C. Accordingly, the capping composition 140 may be coated using the developing solution that was used in the developing process of the photoresist pattern 125. The coating process of the capping composition 140 may be performed in the development unit of the photolithography apparatus without moving the substrate 100. Thereby, a process throughput may be improved.

Figure 6:
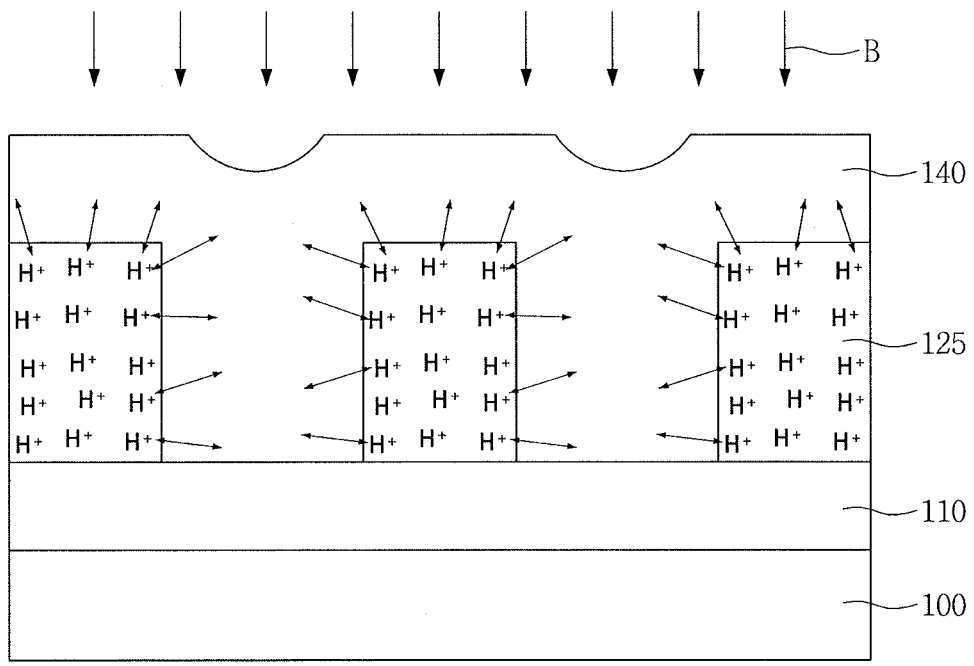

Referring to FIGS. 1 and 6, a bake process B may be performed on the coated capping composition 140.

When the coated capping composition 140 is heat-treated, a cross-linking reaction in which acid ($H^+$) existing on a surface of the photoresist pattern 125 acts as a catalyst may occur to a uniform thickness from a contact area between the coated capping composition 140 and the photoresist pattern 125.

A photoresist pattern obtained in a positive tone development process according to a comparative example has acid only on a side surface thereof. Accordingly, a capping composition is attached on the side surface of the photoresist pattern. However, according to the embodiment, the photoresist pattern 125 may be formed in a negative tone development process. Accordingly, a large amount of acid ($H^+$) may exist on the surface and inside of the photoresist pattern 125. The cross-linking reaction may occur on the entire surface of the photoresist pattern 125 in contact with the coated capping composition 140. Thereby, a capping layer 145 may be formed to be thicker than that formed using a positive-image photoresist pattern.

Figure 11:
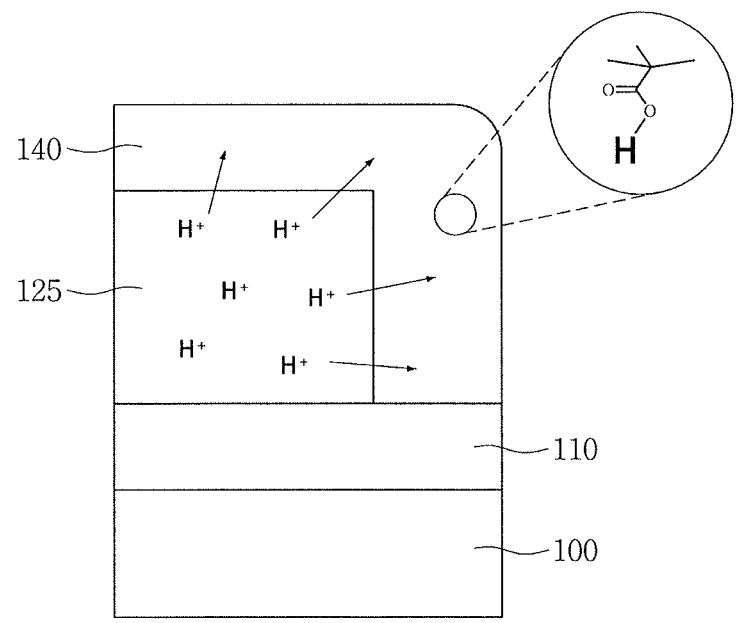
FIG. 11 illustrates a diagram for describing a mechanism of a reaction between a capping composition and a photoresist pattern in accordance with an embodiment.

FIG. 11 illustrates a diagram for describing a mechanism of a reaction between the capping composition 140 and the photoresist pattern 125.

Referring to FIG. 11, when the coated capping composition 140 undergoes a heat treatment using the bake process B, the acid ($H^+$) on the surface of the photoresist pattern 125 may be diffused into the coated capping composition 140.

The diffused acid ($H^+$) may de-protect polymers included in the capping composition 140 and may form ionic bonds with the deprotected polymers. Accordingly, a cured capping layer 145 may be attached on the surfaces, for example, the upper and side surfaces, of the photoresist pattern 125 by a chemical reaction between the capping composition 140 and the diffused acid ($H^+$).

When the capping composition 140 is formed of a polymeric organic compound containing carbon, nitrogen, and hydrogen, for example, a polymeric organic compound containing pyrrolidone or imidazole, the capping layer 145 may be attached on the surface of the photoresist pattern 125 by forming ionic bonds between hydrogen atoms exposed on the surface of the photoresist pattern 125 and nitrogen atoms contained in the capping composition 140.

Figure 7:
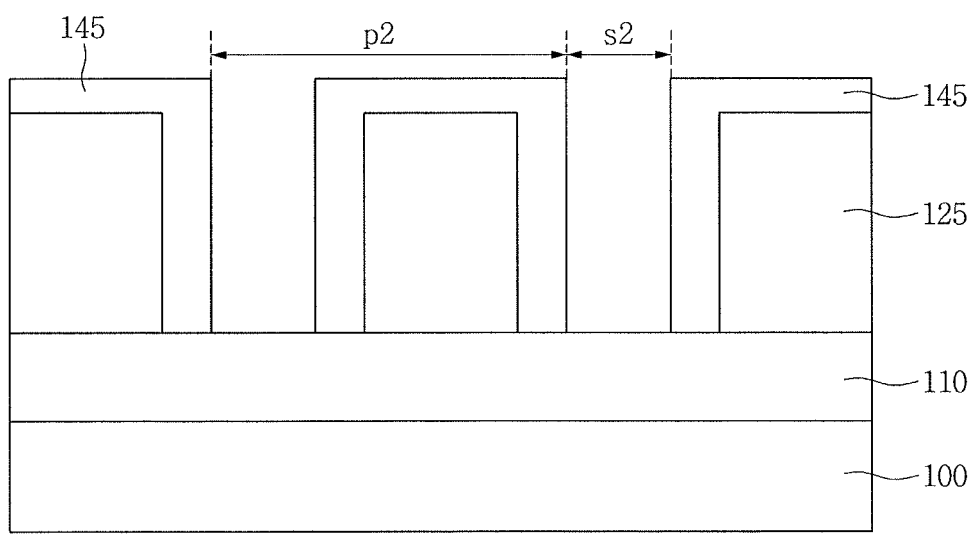

Referring to FIGS. 1 and 7, after finishing the bake process B, the capping composition remaining without forming cross-links with the acid ($H^+$) may be removed by a developing process using the developing solution containing the organic solvent C.

The capping composition 140 may be formed of the resin A2 that is the same as the resin A1 included in the photoresist patterns 125. Accordingly, degradation in etch resistance due to the developing process using the organic solvent C may be prevented.

The capping composition 140 may include polymers having an acid-labile group protecting a hydrophilic group, such as a hydroxy group, a carboxyl group, and a lactone group. During the bake process, the acid ($H^+$) diffused into the coated capping composition 140 may de-protect the polymers included in the capping composition 140. Due to the deprotection reaction by which acid-labile groups of the polymers are substituted by hydrophilic groups, the capping layer 145 attached to the surface of the photoresist pattern 125 may have an increased solubility to an aqueous alkali solution but may have a decreased solubility to the developing solution containing the organic solvent C. Accordingly, during the developing process using the organic solvent C, the capping layer 145 may remain without being dissolved. On the other hand, a remaining part that does not react with the acid ($H^+$) in the coated capping composition 140 may be formed of polymers soluble to the organic solvent C, and therefore, may be removed by being dissolved in the developing solution including the organic solvent C. Accordingly, when the developing process using the organic solvent C is finished, the capping layer 145 may remain only on the upper and side surfaces of the photoresist pattern 125.

When the chemical attachment processes including coating, bake, and developing processes of the capping composition 140 are finished, a second pitch p2 of the photoresist patterns 125 may be the same as the first pitch p1. However, a second space s2 between the photoresist patterns 125 having the capping layers 145 attached thereon may be significantly reduced compared to the first space s1 between the photoresist patterns 125 before coating the capping composition 140. Accordingly, a critical dimension determined depending on the distance between the photoresist patterns 125 may be reduced, resulting in implementation of a micro-pattern.

The developing process of the capping composition 140 may be performed using the developing solution that was used in the developing process of the photoresist pattern 125. The developing process of the photoresist patterns 125, the coating process of the capping composition 140, and the developing process of the capping layer 145 may be carried out in an in-line process in the development unit of the photolithography apparatus. Accordingly, a process throughput may be improved.

Figure 8:
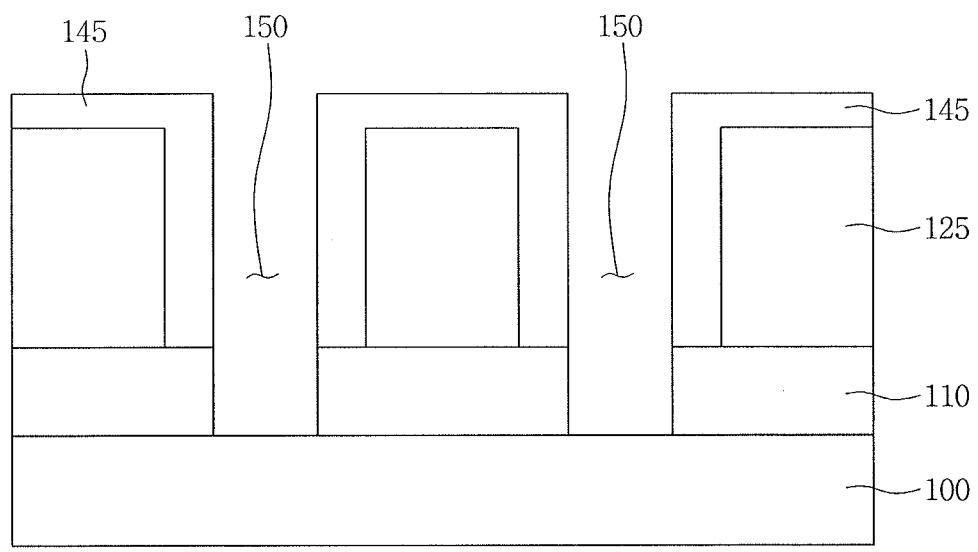

Referring to FIGS. 1 and 8, after finishing the developing process of the capping layer 145, the substrate 100 may be unloaded from the photolithography apparatus.

Figure 10:
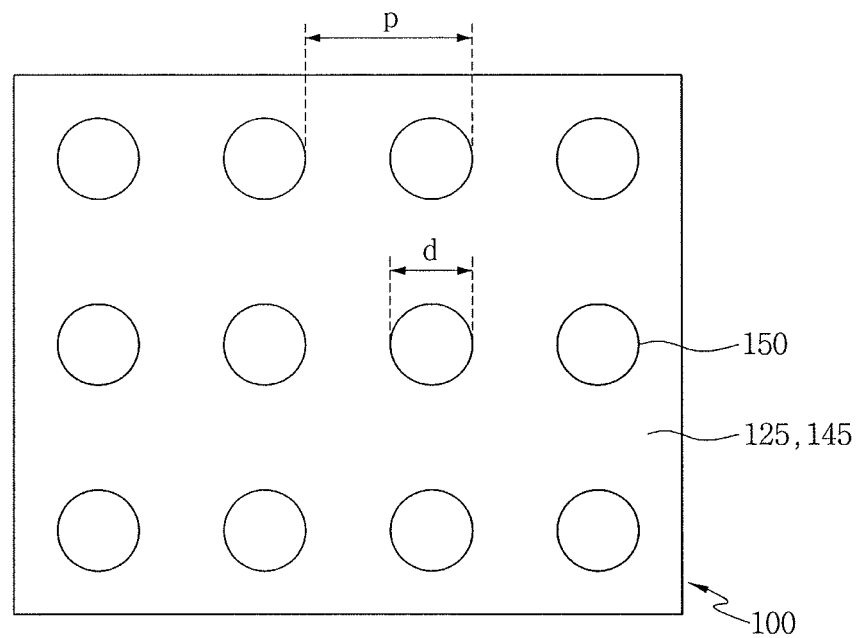

Using the capping layer 145 and the photoresist pattern 125 as an etch mask, the etching target layer 110 thereunder may be etched to form patterns 150. FIG. 10 illustrates the result in which the patterns 150 are formed. In FIG. 10, "d" represents a diameter of the pattern (150), and "p" represents a pitch of the pattern (150).

The method of forming a pattern of a semiconductor device in accordance with the embodiments applies a negative tone developing process using a developing solution containing an organic solvent to a positive type chemically amplified resist composition. Accordingly, the method may be favorable for forming a very small trench pattern or a contact hole pattern, compared to a comparative example positive tone developing process.

Figure 9:
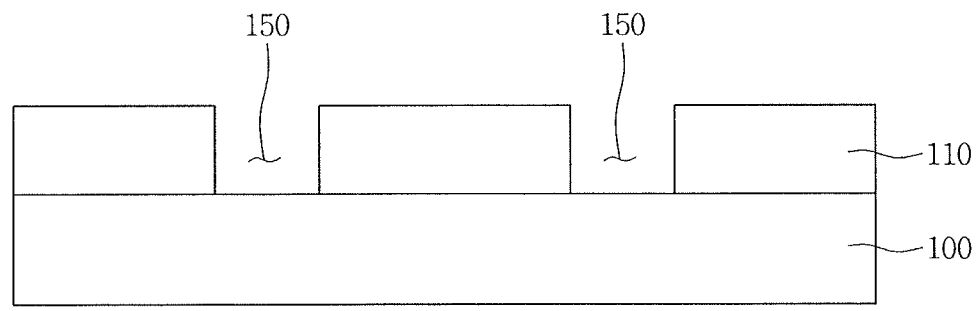

Referring to FIG. 9, the capping layer 145 and the photoresist patterns 125 may be removed by ashing and strip processes.

Figure 13:
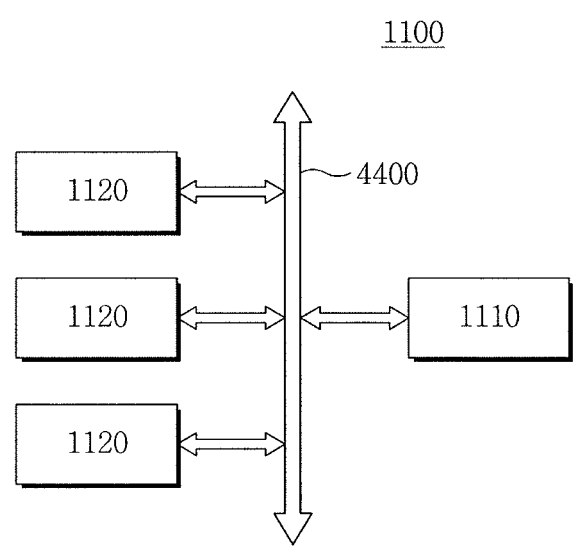
FIG. 13 illustrates a block diagram of a memory system including a semiconductor device fabricated in accordance with an embodiment.

FIG. 13 illustrates a block diagram of a memory system including a semiconductor device fabricated in accordance with an embodiment.

Referring to FIG. 13, a memory system 1100 may be applied to a personal digital assistant (PDA), a personal computer, a web tablet, a wireless phone, a mobile phone, a digital music player, a memory card, or any device that transmits and/or receives information in a wireless environment.

The memory system 1100 may include a controller 1110, an input/output (I/O) device 1120, a memory 1130, an interface 1140, and a bus 4400.

The memory 1130 and the interface 1140 may interact via the bus 4400.

The controller 1110 may include at least one of a microprocessor, a digital signal processor, a microcontroller, or other processing devices similar thereto.

The memory 1130 may be used in storing a command performed by the controller 1110. The memory 1130 may include a semiconductor device formed by a method in accordance with an embodiment.

The I/O device 1120 may receive data or a signal from the outside of the memory system 1100, or may transmit data or a signal to the outside of the memory system 1100. For example, the I/O device 1120 may include a key pad, a key board, and a display.

The interface 1140 may transmit data to a communication network, or receive data from the communication network.

By way of summation and review, as a design rule of a semiconductor device becomes sharply reduced, it becomes desirable to form a micro-pattern having a size less than a resolution limit of a photolithography process. A negative tone development process that is applied to a method of forming a micro pattern of a semiconductor device is limited in next generation lithography (NGL) with a design rule of 10 nm or less. In addition, a chemical attachment process (CAP) for forming a micro pattern using a capping layer formed of a water-soluble material may require additional facility investment, since an in-line process performed in a photolithography apparatus may not be available. Moreover, it may be difficult to reduce a critical dimension of a pattern to a desirable size due to a low etch resistance of the water-soluble capping layer.

According to the embodiments, there is provided a method of forming a micro pattern of a semiconductor device, in which a negative tone development process and chemical attachment process of a photoresist layer may be performed in an in-line process in a photolithography apparatus.

Embodiments provide a method of forming a pattern of a semiconductor device having a micro-sized pattern less than a resolution limit of a photolithography process.

According to an embodiment, a photoresist layer is negatively developed using a developing solution containing an organic solvent C, a capping composition is coated using the organic solvent C, and the capping composition is developed using the developing solution containing the organic solvent C.

The developing process of the photoresist layer and the coating and developing processes of the capping composition are performed in an in-line process in a photolithography apparatus. Accordingly, a process throughput maybe improved.

The capping composition may be formed of a resin A2 that is the same as the resin A1 forming the photoresist layer. Accordingly, degradation in etch resistance due to the developing process using the organic solvent C may be prevented.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A method of forming a pattern of a semiconductor device, the method comprising:
    providing a substrate;
    forming a photoresist layer by coating a resist composition including an acid generator and a first resin, the first resin having an acid-labile group;
    exposing the photoresist layer;
    forming a photoresist pattern by negatively developing the photoresist layer using a developing solution including an organic solvent;
    coating a capping composition including a second resin and an organic solvent on the substrate having the photoresist pattern formed thereon, wherein the capping composition does not include an acid or an acid generator; and
    attaching a capping layer on upper and side surfaces of the photoresist pattern, by baking the capping composition and developing the capping composition using a developing solution including an organic solvent.

2. The method as claimed in claim 1, wherein second resin of the capping composition includes a same polymer or monomer as the first resin of the resist composition.

3. The method as claimed in claim 1, wherein the capping layer is deprotected by acid diffused from the photoresist pattern, to be attached on the upper and side surfaces of the photoresist pattern.

4. The method as claimed in claim 1, wherein the capping composition includes a group that is soluble in the organic solvent.

5. The method as claimed in claim 4, wherein the capping composition includes a polymeric organic compound having a nitrogen atom.

6. The method as claimed in claim 5, wherein the capping layer includes a polymeric organic compound containing imidazole or pyrrolidone.

7. The method as claimed in claim 1, wherein the capping composition includes two functional groups, the two functional groups including a solubility site and an attachment site, respectively.

8. The method as claimed in claim 7, wherein the capping composition includes a polymer having a polyhydroxy styrene (PHS) monomer unit or a polystyrene (PS) monomer unit.

9. The method as claimed in claim 1, wherein the organic solvent includes at least one of an n-butyl acetate solvent, a 2-heptanone solvent, and a 5-methyl-2-hexanone solvent.

10. The method as claimed in claim 1, wherein the organic solvent includes at least one selected from the group of an acetate-based solvent, an ether-based solvent, a ketone-based solvent, an ester-based solvent, an amide-based solvent, a propionate-based solvent, a butyrate-based solvent, a lactate-based solvent, and a combination thereof.

11. The method as claimed in claim 1, wherein the resist composition includes a positive type chemically amplified resist that increases in solubility to an alkaline solution under action of the acid generator.

12. The method as claimed in claim 1, further comprising, after forming the capping layer:
    performing an etch process using the capping layer and the photoresist pattern; and
    removing the capping layer and the photoresist pattern.

13. The method as claimed in claim 1, wherein the substrate includes an etching target layer formed thereon.

14. A method of forming a pattern of a semiconductor device, the method comprising:
   loading a substrate into a photolithography apparatus;
   forming a photoresist layer by coating a resist composition including an acid generator and a first resin, the first resin having an acid-labile group;
   exposing the photoresist layer;
   forming a photoresist pattern by negatively developing the photoresist layer using a developing solution containing an organic solvent;
   coating a capping composition including a second resin and an organic solvent on the substrate having the photoresist pattern formed thereon, wherein the capping composition does not include an acid or an acid generator;
   attaching a capping layer on upper and side surfaces of the photoresist pattern by baking the capping composition and developing the capping composition using the developing solution including the organic solvent; and
   unloading the substrate from the photolithography apparatus.

15. A method of forming a pattern of a semiconductor device, the method comprising:
   forming a photoresist layer on a substrate by coating a resist composition including an acid generator and a first resin having an acid-labile group onto the substrate;
   selectively exposing the photoresist layer;
   forming a photoresist pattern by removing unexposed portions of the photoresist layer using a developing solution including a first organic solvent;
   coating a capping composition onto the substrate having the photoresist pattern formed thereon, the capping composition including a second resin having an acid-labile group and a second organic solvent and not including an acid or an acid generator;
   baking the substrate having the photoresist pattern and capping composition formed thereon, such that a capping layer is formed from the capping composition at a contact area between the capping composition and the photoresist pattern; and
   removing a portion of the capping composition that does not form the capping layer.

16. The method of claim 15, wherein:
   the second resin of the capping composition including the acid-labile group decreases in solubility to an organic solvent when reacted with an acid.

17. The method of claim 15, wherein:
   the second resin of the capping composition includes a same polymer or monomer as the first resin of the resist composition, and the first organic solvent is the same as the second organic solvent.

18. The method of claim 15, wherein removing the portion of the capping composition that does not form the capping layer forms a pattern including the photoresist pattern and the capping layer formed thereon.

19. The method of claim 18, further including etching the substrate using the photoresist pattern and the capping layer formed thereon as an etch mask.

* * * * *